United States Patent
Komatsu et al.

(10) Patent No.: US 9,337,331 B2
(45) Date of Patent: May 10, 2016

(54) SEMICONDUCTOR DEVICE

(71) Applicant: KABUSHIKI KAISHA TOSHIBA, Minato-ku, Tokyo (JP)

(72) Inventors: Kanako Komatsu, Yokohama Kanagawa (JP); Mariko Shimizu, Ota Tokyo (JP); Jun Morioka, Yokohama Kanagawa (JP); Keita Takahashi, Yokohama Kanagawa (JP); Masahito Nishigoori, Ota Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/826,884

(22) Filed: Aug. 14, 2015

(65) Prior Publication Data

US 2015/0357464 A1    Dec. 10, 2015

Related U.S. Application Data

(63) Continuation of application No. 14/454,555, filed on Aug. 7, 2014, now Pat. No. 9,142,613, which is a continuation-in-part of application No. 13/764,577, filed on Feb. 11, 2013, now Pat. No. 8,836,025.

(30) Foreign Application Priority Data

Aug. 23, 2012  (JP) ................................ 2012-184144

(51) Int. Cl.
*H01L 29/78*    (2006.01)
*H01L 29/06*    (2006.01)
*H01L 29/10*    (2006.01)
*H01L 27/088*   (2006.01)
*H01L 29/08*    (2006.01)

(52) U.S. Cl.
CPC .......... *H01L 29/7816* (2013.01); *H01L 27/088* (2013.01); *H01L 29/0619* (2013.01);

(Continued)

(58) Field of Classification Search
CPC ......... H01L 29/78; H01L 29/06; H01L 29/10; H01L 29/7816; H01L 29/1095; H01L 29/1045; H01L 29/0619; H01L 27/088
USPC ......... 257/335, 328–334, 336–339, 344, 371, 257/387
See application file for complete search history.

(56) References Cited

U.S. PATENT DOCUMENTS 5,117,274 A    5/1992    Mastroianni
5,424,572 A    6/1995    Solheim (Continued)

FOREIGN PATENT DOCUMENTS

| JP | 10214970 A | 8/1998 |
| JP | 10335630 A | 12/1998 |
| JP | 2006278832 A | 10/2006 |

OTHER PUBLICATIONS

Chinese Office Action (and English translation thereof) dated Nov. 3, 2015, issued in counterpart Chinese Application No. 201310093453.9.

*Primary Examiner* — Chuong A Luu
(74) *Attorney, Agent, or Firm* — Holtz, Holtz & Volek PC

(57) ABSTRACT

A semiconductor device includes a first semiconductor layer of a first conductivity type, and a second semiconductor layer of a second conductivity type provided on part of the first semiconductor layer in each of a first region and a second region separated from each other. A first distance is a distance between both ends of the first insulating film in a direction connecting the fourth semiconductor layer and the sixth semiconductor layer. The first distance in the first region is longer than the first distance in the second region. A second distance is a distance between the third semiconductor layer and the seventh semiconductor layer. The second distance in the first region is longer than the second distance in the second region.

18 Claims, 11 Drawing Sheets

(52) U.S. Cl.
CPC ........ *H01L29/0653* (2013.01); *H01L 29/1045* (2013.01); *H01L 29/1083* (2013.01); *H01L 29/1095* (2013.01); *H01L 29/7835* (2013.01); *H01L 29/0696* (2013.01); *H01L 29/0847* (2013.01)

(56) References Cited

U.S. PATENT DOCUMENTS

| | | | |
|---|---|---|---|
| 5,591,661 A * | 1/1997 | Shiota | H01L 27/0255 257/E27.033 |
| 7,211,863 B2 * | 5/2007 | Williams | H01L 21/26513 257/338 |
| 7,718,494 B2 * | 5/2010 | Tsai | H01L 21/823412 257/391 |
| 2006/0197149 A1 * | 9/2006 | Fujimoto | H01L 21/823814 257/335 |
| 2008/0067585 A1 | 3/2008 | Williams et al. | |
| 2009/0179276 A1 | 7/2009 | Voldman | |
| 2010/0155895 A1 | 6/2010 | Tsai | |
| 2010/0163973 A1 | 7/2010 | Nakamura et al. | |
| 2011/0248347 A1 | 10/2011 | Benaissa et al. | |
| 2013/0200452 A1 | 8/2013 | You et al. | |

* cited by examiner

IMPURITY DISTRIBUTION

ELECTRIC FIELD DISTRIBUTION

IMPACT ION CURRENT DISTRIBUTION

HOLE CURRENT DISTRIBUTION

ELECTRON CURRENT DISTRIBUTION

HOLE CURRENT
(AFTER PUNCH THROUGH)

SEMICONDUCTOR DEVICE

CROSS-REFERENCE TO RELATED APPLICATIONS

This is Continuation application of application Ser. No. 14/454,555, filed on Aug. 7, 2014, now U.S. Pat. No. 9,142,613 which is a Continuation-in-Part application of application Ser. No. 13/764,577, filed on Feb. 11, 2013 now U.S. Pat. No. 8,836,025; the entire contents of which are incorporated herein by reference.

This application is based upon and claims the benefit of priority from Japanese Patent Application No. 2012-184144, filed on Aug. 23, 2012; the entire contents of which are incorporated herein by reference.

FIELD

Embodiments described herein relate generally to a semiconductor device.

BACKGROUND

Among numerous kinds of power devices, DMOS (double-diffused metal oxide semiconductor FET) is characterized by high switching speed, high conversion efficiency in the low voltage region, and compatibility between high breakdown voltage and low on-resistance. With regard to specific applications, DMOS is widely used as a switching element in a motor driver, power supply and the like, and as an analog output element in an audio amplifier.

Techniques for incorporating DMOS having a plurality of breakdown voltage levels on one chip have also been developed. Thus, a DMOS having an appropriate breakdown voltage can be used in accordance with the purpose of the circuit. This can optimize the chip size. However, also in this case, to ensure the breakdown voltage of the entire chip, the punch through voltage to the substrate is preferably set to a certain value or more among a plurality of kinds of DMOS having different breakdown voltage levels.

DETAILED DESCRIPTION

In general, according to one embodiment, a semiconductor device includes a first semiconductor layer of a first conductivity type, a second semiconductor layer of a second conductivity type, a third semiconductor layer of the second conductivity type, a fourth semiconductor layer of the first conductivity type, a fifth semiconductor layer of the first conductivity type, a sixth semiconductor layer of the first conductivity type and a seventh semiconductor layer of the first conductivity type. The second semiconductor layer is provided on part of the first semiconductor layer in each of a first region and a second region. The first region and the second region are separated from each other. The third semiconductor layer is provided on part of the second semiconductor layer in each of the first region and the second region. The third semiconductor layer has a higher effective impurity concentration than the second semiconductor layer. The fourth semiconductor layer is provided on part of the third semiconductor layer. The fifth semiconductor layer is provided on another part of each of the second semiconductor layers. The sixth semiconductor layer is provided on part of the fifth semiconductor layer. The sixth semiconductor layer has a higher effective impurity concentration than the fifth semiconductor layer. The seventh semiconductor layer is separated from each of the second semiconductor layers. The seventh semiconductor layer has a higher effective impurity concentration than the first semiconductor layer. The semiconductor device includes a first insulating film, a gate insulating film, and a gate electrode. The first insulating film is provided on part of the fifth semiconductor layer between the fourth semiconductor layer and the sixth semiconductor layer. The gate insulating film is provided on a portion of the second semiconductor layer and the third semiconductor layer between the fourth semiconductor layer and the fifth semiconductor layer. The gate electrode is provided on the gate insulating film. A first distance is a distance between both ends of the first insulating film in a direction connecting the fourth semiconductor layer and the sixth semiconductor layer. The first distance in the first region is longer than the first distance in the second region. A second distance is a distance between the third semiconductor layer and the seventh semiconductor layer. The second distance in the first region is longer than the second distance in the second region.

Embodiments of the invention will now be described with reference to the drawings.

First, a first embodiment is described.

Figure 1A:
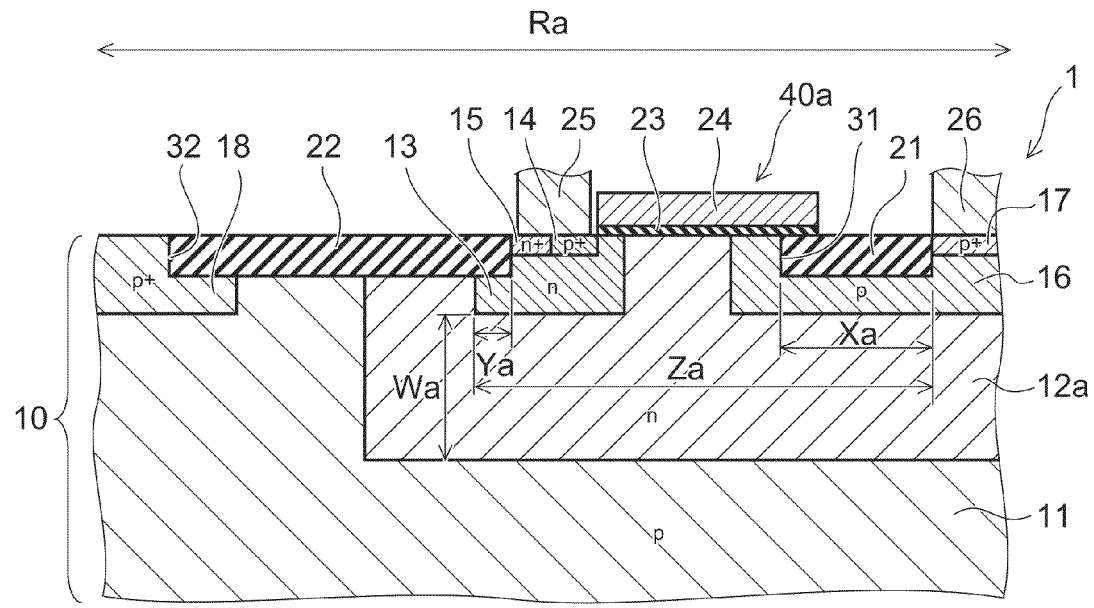
FIGS. 1A and 1B are sectional views illustrating a semiconductor device according to a first embodiment.
Figure 1B:
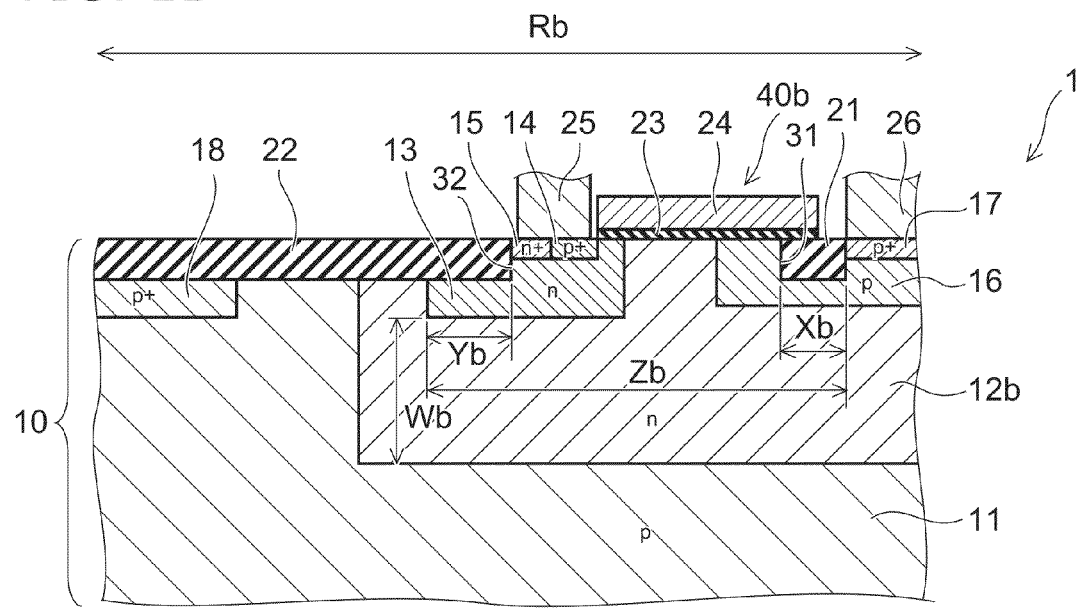

FIGS. 1A and 1B are sectional views illustrating a semiconductor device according to the embodiment.

FIGS. 1A and 1B show different regions on the same semiconductor substrate.

The semiconductor device according to the embodiment is a semiconductor device including a plurality of DMOS having different breakdown voltage levels. For instance, the semiconductor device is used as a switching element in e.g. a motor driver or power supply, or as an analog output element in an audio amplifier.

As shown in FIGS. 1A and 1B, the semiconductor device 1 according to the embodiment includes a semiconductor substrate 10. The semiconductor substrate 10 is formed from e.g. monocrystalline silicon. A p-type layer 11 is formed in at least an upper portion of the semiconductor substrate 10. The p-type layer 11 may reach the lower surface of the semiconductor substrate 10.

In the semiconductor substrate 10, two DMOS regions Ra and Rb separated from each other are defined. In the DMOS regions Ra and Rb, respectively, deep n-wells 12a and 12b shaped like islands and having n-type conductivity are formed on part of the p-type layer 11. In the following, the "deep n-well 12a" and "deep n-well 12b" are also collectively referred to as "deep n-well 12". Likewise, in this description, for a particular component, when the component placed in the region Ra and the component placed in the region Rb need to be distinguished, the reference numeral of the component is suffixed with "a" or "b". When there is no need for distinction, the reference numeral is not suffixed with "a" and "b".

First, for the DMOS regions Ra and Rb, the common configuration is described.

An n-type well 13 is provided on part of the deep n-well 12. The conductivity type of the n-type well 13 is n-type. The effective impurity concentration of the n-type well 13 is higher than the effective impurity concentration of the deep n-well 12. In this description, the "effective impurity concentration" refers to the concentration of impurity contributing to the conduction of the semiconductor material. For instance, in the case where the semiconductor material contains both impurity serving as donor and impurity serving as acceptor, the "effective impurity concentration" refers to the concentration except the amount of donor and acceptor canceling each other.

A $p^+$-type source layer 14 is provided on part of the n-type well 13. An $n^+$-type back gate layer 15 is provided on another part of the n-type well 13. The effective impurity concentration of the $n^+$-type back gate layer 15 is higher than the effective impurity concentration of the n-type well 13. The $p^+$-type source layer 14 and the $n^+$-type back gate layer 15 are in contact with each other.

A p-type well 16 is provided on another part of the deep n-well 12. The p-type well 16 is separated from the n-type well 13 by the deep n-well 12. A $p^+$-type drain layer 17 is provided on part of the p-type well 16. The $p^+$-type drain layer 17 is separated from the deep n-well 12 by the p-type well 16. The effective impurity concentration of the $p^+$-type drain layer 17 is higher than the effective impurity concentration of the p-type well 16. A $p^+$-type device isolation region 18 is provided around the deep n-well 12 on the p-type layer 11. The $p^+$-type device isolation region 18 is separated from the deep n-well 12 by the p-type layer 11. The effective impurity concentration of the $p^+$-type device isolation region 18 is higher than the effective impurity concentration of the p-type layer 11. The p-type layer 11, the deep n-well 12, the n-type well 13, the $p^+$-type source layer 14, the $n^+$-type back gate layer 15, the p-type well 16, the $p^+$-type drain layer 17, and the $p^+$-type device isolation region 18 are part of the semiconductor substrate 10.

On the semiconductor substrate 10, field insulating films 21 and 22, a gate insulating film 23, a gate electrode 24, a source electrode 25, and a drain electrode 26 are provided.

The field insulating films 21 and 22 are formed from e.g. silicon oxide. The field insulating films 21 and 22 are buried in a recess 31 and in a recess 32, respectively, formed in the upper surface of the semiconductor substrate 10. The field insulating films 21 and 22 are e.g. STI (shallow trench isolation) or LOCOS (local oxidation of silicon).

The field insulating film 21 is placed between the $p^+$-type source layer 14 and the $p^+$-type drain layer 17. Specifically, the field insulating film 21 is placed on part of the p-type well 16 and on the n-type well 13 side as viewed from the $p^+$-type drain layer 17. On the other hand, the field insulating film 22 is placed on a region including the outer edge of the deep n-well 12. Specifically, the field insulating film 22 is placed from the end portion of the n-type well 13 on the outer peripheral side of the deep n-well 12 to the portion of the p-type layer 11 outside the deep n-well 12. More specifically, the field insulating film 22 is placed in a region extending from a portion above the n-type well 13 on the side opposite from the p-type well 16 as viewed from the $n^+$-type back gate layer 15, passing above a portion of the deep n-well 12, passing above a portion of the p-type layer 11, and extending to a portion above the $p^+$-type device isolation region 18.

The gate insulating film 23 is made of e.g. silicon oxide. The gate insulating film 23 is placed on a portion between the $p^+$-type source layer 14 and the $p^+$-type drain layer 17. The gate insulating film 23 is placed at least on the portion of n-type conductivity. In the embodiment, the gate insulating film 23 is placed in a region extending from above the end portion of the field insulating film 21 on the n-type well 13 side, passing above the portion of the p-type well 16 between the field insulating film 21 and the deep n-well 12 and above the portion of the deep n-well 12 between the p-type well 16 and the n-type well 13, and extending to above the portion of the n-type well 13 between the deep n-well 12 and the $p^+$-type source layer 14. The gate electrode 24 is provided on the gate insulating film 23. Furthermore, the source electrode 25 is connected to the $p^+$-type source layer 14 and the $n^+$-type back gate layer 15. The drain electrode 26 is connected to the $p^+$-type drain layer 17.

Thus, DMOS 40a and 40b are formed in the DMOS regions Ra and Rb, respectively. The DMOS 40 is LDMOS (lateral DMOS), and is DEMOS (drain extended MOS) or EDMOS (extended drain MOS). The DMOS 40 is isolated from the surroundings by the field insulating film 22 and the $p^+$-type device isolation region 18. In the DMOS 40, the n-type well 13 doubles as a body region and a channel region. In the n-type well 13, the body region and the channel region may be formed by separate processes. The p-type well 16 functions as a drift region. In the case where the $p^+$-type drain layer 17 extends to immediately below the gate insulating film 23, the p-type well 16 can be omitted. The field insulating film 21 provides isolation between the source and the drain in each DMOS 40.

Next, differences between the DMOS region Ra and the DMOS region Rb are described.

As described above, the DMOS 40a formed in the DMOS region Ra and the DMOS 40b formed in the DMOS region Rb are identical in layer structure. However, the dimensions are partly different.

Between the DMOS 40a and the DMOS 40b, the end-to-end distance X of the field insulating film 21 in the direction connecting the $p^+$-type source layer 14 and the $p^+$-type drain layer 17 (hereinafter also referred to as "SD direction") is mutually different. That is, the distance Xa of the DMOS 40a is longer than the distance Xb of the DMOS 40b.

Furthermore, between the DMOS 40a and the DMOS 40b, the distance Y from the edge of the field insulating film 22 on the inner peripheral side of the deep n-well 12, i.e., on the p$^+$-type drain layer 17 side, to the edge of the n-type well 13 on the outer peripheral side of the deep n-well 12, i.e., on the side opposite from the pt-type drain layer 17, is mutually different. That is, the distance Ya of the DMOS 40a is shorter than the distance Yb of the DMOS 40b. As viewed from above, the distance Y corresponds to the width of the region including both the n-type well 13 and the field insulating film 22, i.e., the width of the overlapping region of the n-type well 13 and the field insulating film 22. In this case, the "width" corresponds to the length in the direction from the inner peripheral side toward the outer peripheral side of the DMOS region. In the cross section shown in FIGS. 1A and 1B, the "width" corresponds to the length in the SD direction.

That is, Xa>Xb and Ya<Yb hold. Thus, the size relation of the distances X and the size relation of the distances Y are in a complementary relationship. However, the distance Z from the edge of the p$^+$-type drain layer 17 on the outer peripheral side of the DMOS region to the edge of the n-type well 13 on the outer peripheral side of the DMOS region may not be equal between the DMOS 40a and the DMOS 40b. That is, for the distance Z, which includes the distance X and the distance Y, either of Za≠Zb and Za=Zb may hold.

On the other hand, in the DMOS 40a and the DMOS 40b, the dimensions other than the aforementioned distance X and distance Y determined independently of the distances X and Y are mutually equal. For instance, the distance W between the lower surface of the deep n-well 12 and the lower surface of the n-type well 13 is mutually equal between the DMOS region Ra and the DMOS region Rb. That is, Wa=Wb holds. Here, as described above, the distance Z depends on the distances X and Y, and hence may or may not be mutually equal.

The impurity concentration of each layer constituting the semiconductor substrate 10 is mutually equal between the DMOS region Ra and the DMOS region Rb. For instance, the impurity concentration of the deep n-well 12a is nearly equal to the impurity concentration of the deep n-well 12b. The impurity concentration of the n-type well 13, the impurity concentration of the p$^+$-type source layer 14, the impurity concentration of the n$^+$-type back gate layer 15, the impurity concentration of the p-type well 16, the impurity concentration of the p$^+$-type drain layer 17, and the impurity concentration of the p$^+$-type device isolation region 18 are mutually nearly equal between the DMOS region Ra and the DMOS region Rb.

Next, the function and effect of the semiconductor device 1 according to the embodiment are described.

As shown in FIGS. 1A and 1B, between the DMOS 40a and the DMOS 40b, the distance X, i.e., the length of the field insulating film 21 in the SD direction, is mutually different, i.e., Xa>Xb. Thus, the source-drain current path in the DMOS 40a is longer than the source-drain current path in the DMOS 40b. As a result, the source-drain breakdown voltage (hereinafter also referred to as "SD breakdown voltage") of the DMOS 40a is higher than the SD breakdown voltage of the DMOS 40b. Thus, the semiconductor device 1 includes two kinds of DMOS different in SD breakdown voltage. As a result, a DMOS having an appropriate breakdown voltage can be used in accordance with the purpose of the circuit. This can optimize the chip size.

Furthermore, between the DMOS 40a and the DMOS 40b, the distance Y is mutually different, i.e., Ya<Yb. As a result, the DMOS 40a and 40b are nearly equal in punch through breakdown voltage to the semiconductor substrate 10 (hereinafter also referred to as "substrate breakdown voltage"). In the following, this effect is described.

Figure 2:
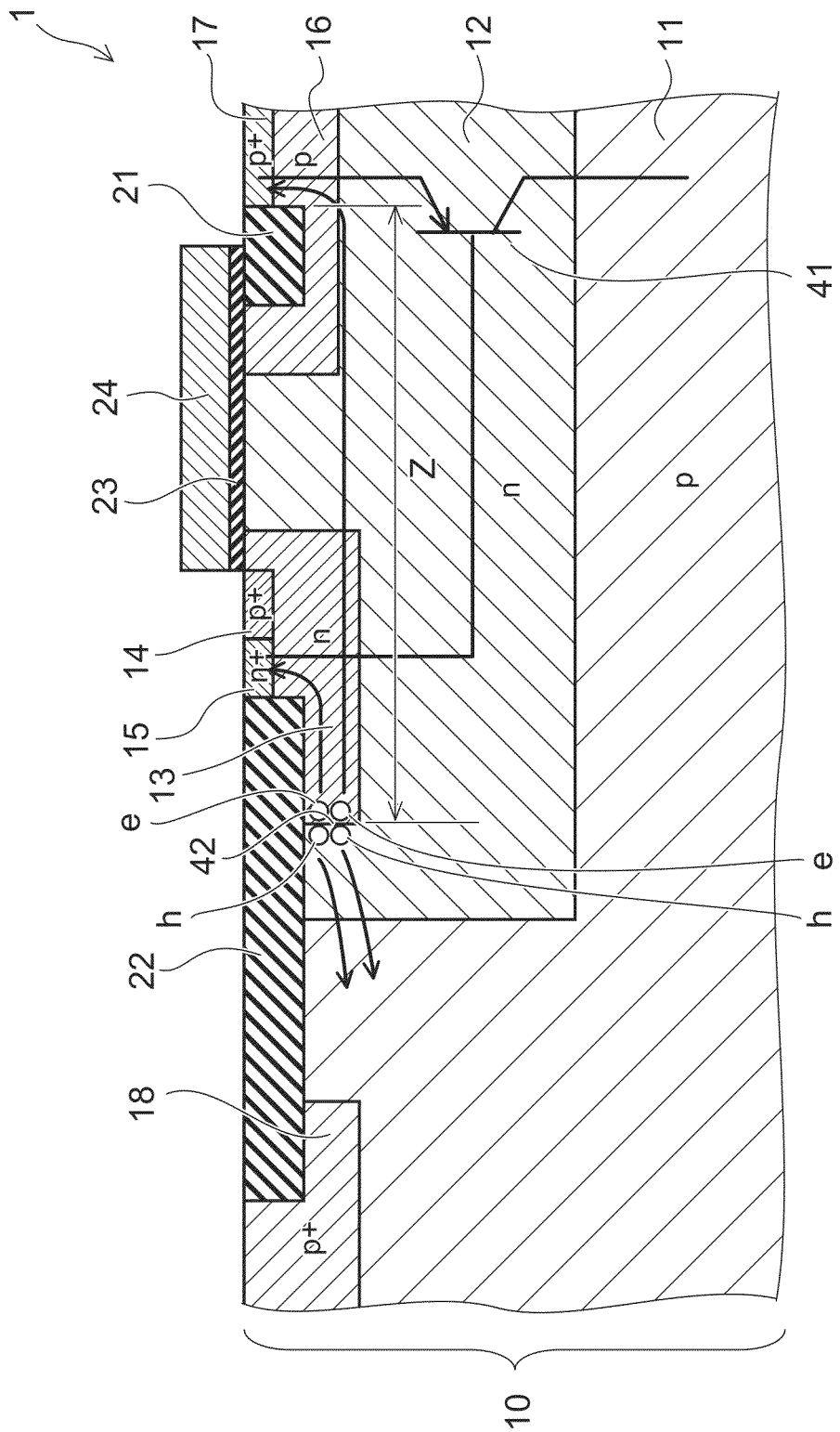
FIG. 2 is a schematic sectional view illustrating the operation of the semiconductor device according to the first embodiment.

FIG. 2 is a schematic sectional view illustrating the operation of the semiconductor device according to the embodiment.

As shown in FIG. 2, the DMOS 40 includes a parasitic pnp bipolar transistor 41 with the p-type layer 11 serving as a collector, the deep n-well 12 serving as a base, and the p-type well 16 and the p$^+$-type drain layer 17 serving as an emitter. The substrate breakdown voltage of the DMOS 40 is determined by the lower breakdown voltage of the pn junction breakdown voltage between the p-type layer 11 and the deep n-well 12, and the collector-emitter breakdown voltage of the parasitic pnp bipolar transistor 41. The pn junction breakdown voltage is determined by the distance between the deep n-well 12 and the p$^+$-type device isolation region 18. Thus, preferably, this distance is made sufficiently long.

The collector-emitter breakdown voltage of the parasitic pnp bipolar transistor 41 depends on the distance Z. The reason for this is as follows.

Figure 3A:
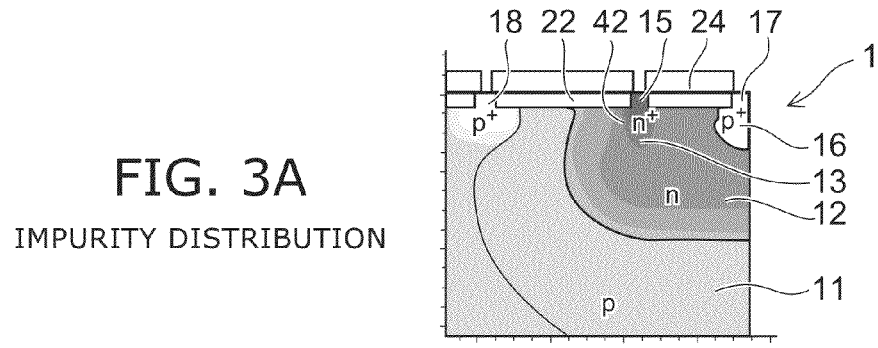
FIGS. 3A to 3E show simulation results illustrating the operation of the semiconductor device according to the first embodiment.
Figure 3B:
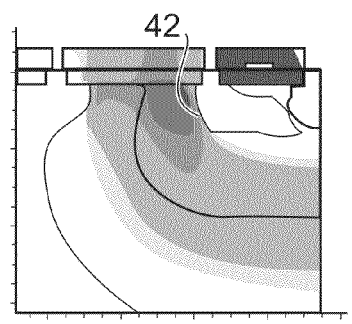
Figure 3C:
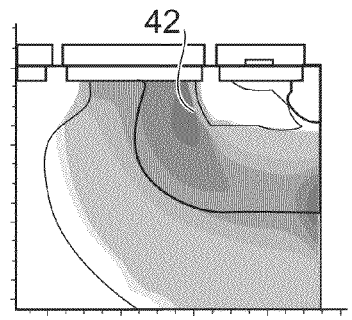
Figure 3D:
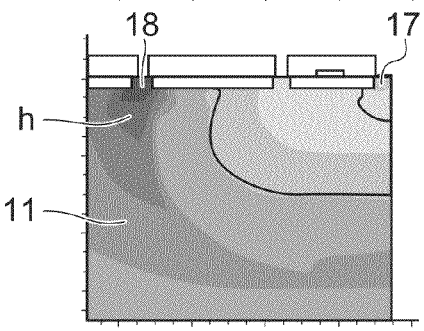
Figure 3E:
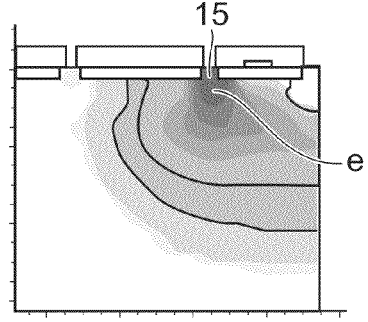

FIGS. 3A to 3E show simulation results illustrating the operation of the semiconductor device according to the embodiment. FIG. 3A shows the impurity distribution. FIG. 3B shows the electric field distribution. FIG. 3C shows the current distribution due to impact ions. FIG. 3D shows the hole current distribution. FIG. 3E shows the electron current distribution.

FIGS. 3B to 3E show the state in which no punch through occurs.

Figure 4:
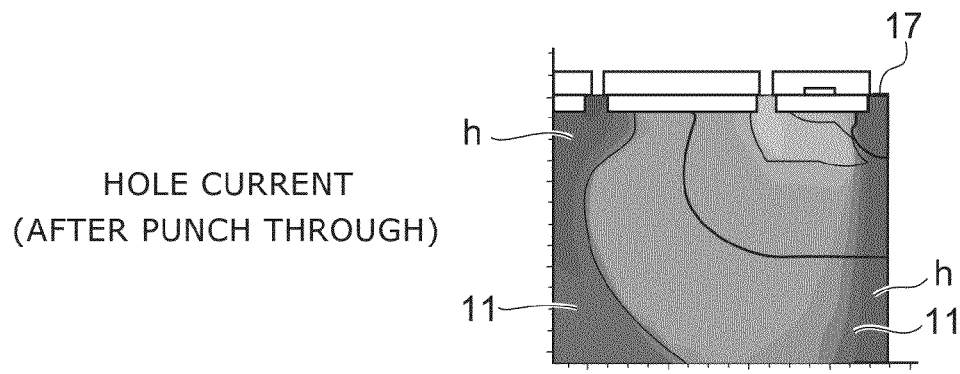
FIG. 4 shows a simulation result illustrating the operation of the semiconductor device according to the first embodiment.

FIG. 4 shows a simulation result illustrating the operation of the semiconductor device according to the embodiment. FIG. 4 shows the hole current distribution of the state in which a punch through occurs.

The semiconductor device 1 having an impurity concentration distribution as shown in FIG. 3A is assumed. A ground potential is applied to the p-type layer 11. A positive potential is applied to the deep n-well 12 and the p$^+$-type drain layer 17. Then, as shown in FIG. 3B, the electric field concentrates on the end surface of the n-type well 13 on the outer peripheral side of the device, i.e., the end surface 42 on the side opposite from the p$^+$-type drain layer 17. Thus, as shown in FIG. 3C, impact ionization occurs near the end surface 42. This produces pairs of electrons e and holes h. Then, as shown in FIG. 3D, holes h flow into the p-type layer 11 and are ejected from the semiconductor device 1 via the p$^+$-type device isolation region 18. Furthermore, as shown in FIG. 3E, if electrons e flow into the n$^+$-type back gate layer 15, they are rapidly ejected from the semiconductor device 1, and hence cause no problem.

However, as shown in FIG. 2, some of the electrons e may flow into the p$^+$-type drain layer 17. Then, an electron current flows between the base and the emitter of the parasitic pnp bipolar transistor 41, and turns on the parasitic pnp bipolar transistor 41. Thus, as shown in FIG. 4, a current flows between the p-type layer 11 serving as a collector and the p$^+$-type drain layer 17 serving as an emitter.

Electrons e produced at the end surface 42 by impact ionization flow into the p$^+$-type drain layer 17. The amount of such electrons e flowing into the p$^+$-type drain layer 17 depends on the distance Z between the end surface 42 and the p$^+$-type drain layer 17. As the distance Z becomes shorter, electrons e are more likely to flow into the p$^+$-type drain layer 17. Thus, if the distance Z is short, the parasitic pnp bipolar transistor 41 is more likely to be turned on. This decreases the collector-emitter breakdown voltage, and decreases the substrate breakdown voltage of the DMOS 40.

Figure 5:
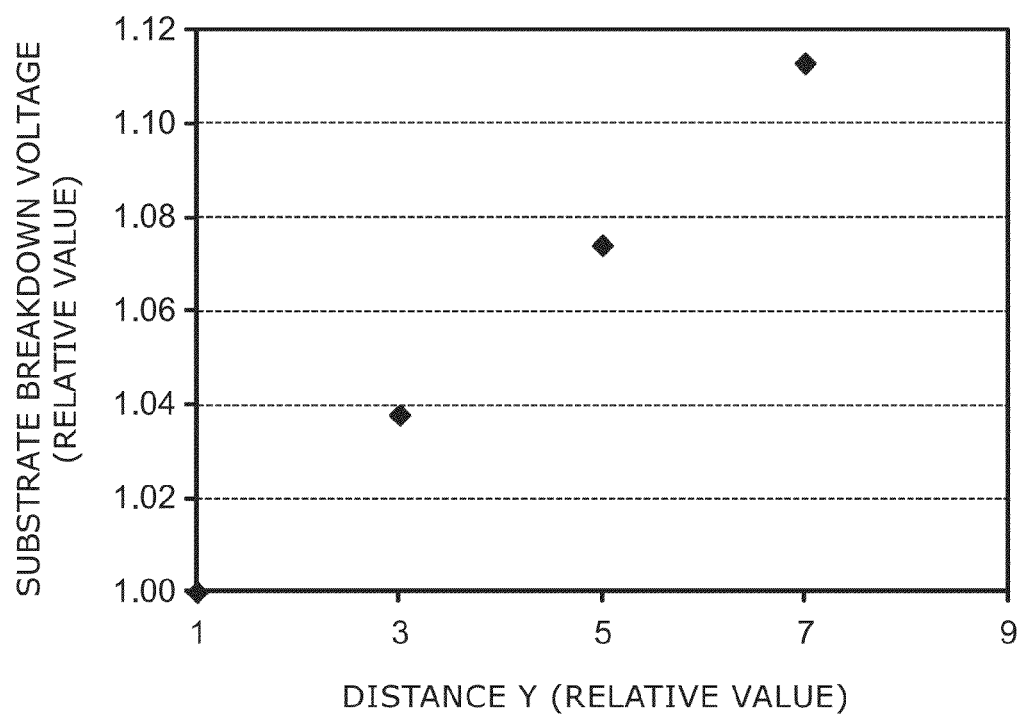
FIG. 5 is a graph illustrating the influence of the distance Y on the substrate breakdown voltage with the distance X left constant.

FIG. 5 is a graph illustrating the influence of the distance Y on the substrate breakdown voltage with the distance X left constant. The horizontal axis represents the distance Y, and the vertical axis represents the substrate breakdown voltage.

As shown in FIG. 5, according to simulation, if the distance X is constant, the substrate breakdown voltage is increased as the distance Y becomes longer.

Thus, in the embodiment, in the DMOS 40 in which the distance X is made relatively short to set the SD breakdown voltage to be relatively low, the distance Y is made relatively long. Thus, the decrease of the distance X is compensated by the increase of the distance Y. This avoids excessive decrease of the distance Z despite the decrease of the distance X, and suppresses the decrease of the substrate breakdown voltage. As a result, between the DMOS 40a and 40b different in SD breakdown voltage, the substrate breakdown voltage can be maintained within a certain range.

Thus, according to the embodiment, in the semiconductor device 1 including a plurality of kinds of DMOS 40 different in SD breakdown voltage, the substrate breakdown voltage can be made uniform. For instance, the semiconductor device 1 may be incorporated in a vehicle-mounted product to be mounted on an automobile. In this case, the semiconductor device 1 is required to withstand the load dump surge. Thus, the substrate breakdown voltage is preferably made comparable to e.g. the maximum SD breakdown voltage or more. The embodiment can realize such a semiconductor device 1.

Furthermore, in the embodiment, between the DMOS regions, the impurity concentration of each layer is made equal, and only the dimensions are made different to control the SD breakdown voltage. Thus, a plurality of kinds of DMOS can be separately formed by the same process flow. As a result, a semiconductor device including DMOS having a plurality of SD breakdown voltage levels can be manufactured at low cost. Furthermore, because the impurity concentration of each layer is made equal between the DMOS regions, the variation of DMOS characteristics between the DMOS regions is small.

Moreover, in the embodiment, the substrate breakdown voltage is increased by controlling the operation of the parasitic pnp bipolar transistor 41. Thus, there is no need to form a deep trench and to bury an insulating material therein, or to form an insulative buried layer. Accordingly, the manufacturing cost is low.

Next, a comparative example is described.

Figure 6A:
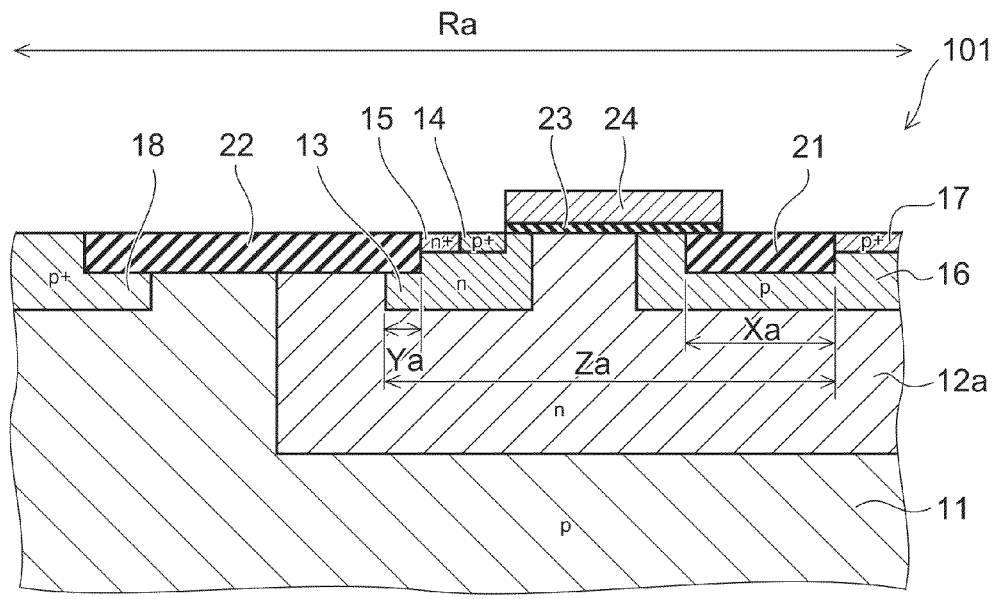
FIGS. 6A and 6B are sectional views illustrating a semiconductor device according to the comparative example.
Figure 6B:
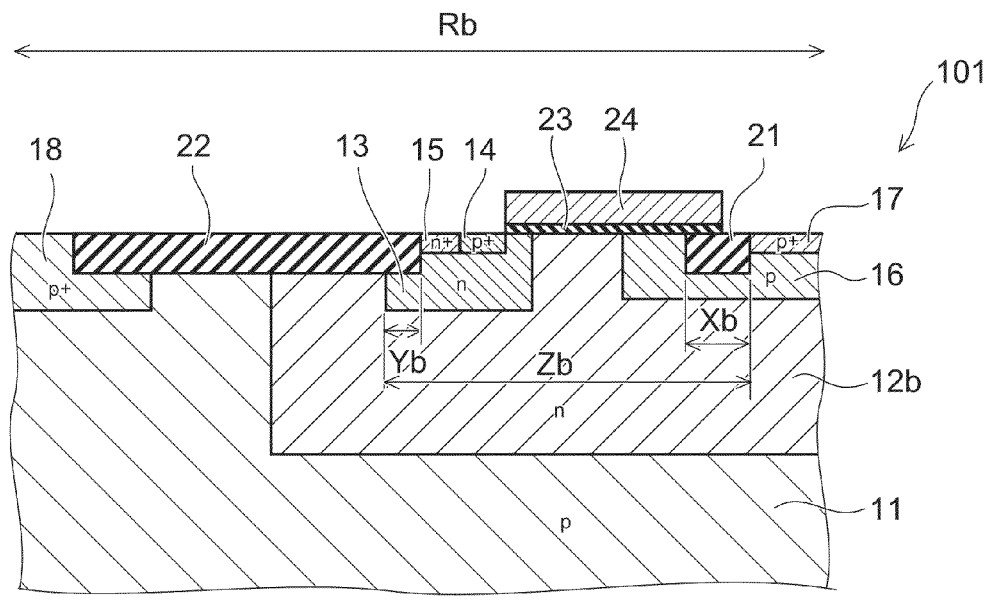

FIGS. 6A and 6B are sectional views illustrating a semiconductor device according to the comparative example.

FIGS. 6A and 6B show different regions on the same semiconductor substrate.

As shown in FIGS. 6A and 6B, in the semiconductor device 101 according to the comparative example, the distance Y is fixed between the DMOS region Ra and the DMOS region Rb. Thus, if the distance X is adjusted to obtain a desired SD breakdown voltage, the distance Z changes in conjunction with the distance X. That is, because Ya=Yb, Xa>Xb results in Za>Zb. As a result, the substrate breakdown voltage is changed. Thus, in the semiconductor device 101 according to the comparative example, the SD breakdown voltage and the substrate breakdown voltage cannot be independently controlled. The DMOS with the SD breakdown voltage set lower has a lower substrate breakdown voltage. Thus, the semiconductor device 101 as a whole is likely to fail to ensure a necessary substrate breakdown voltage.

Next, a second embodiment is described.

Figure 7A:
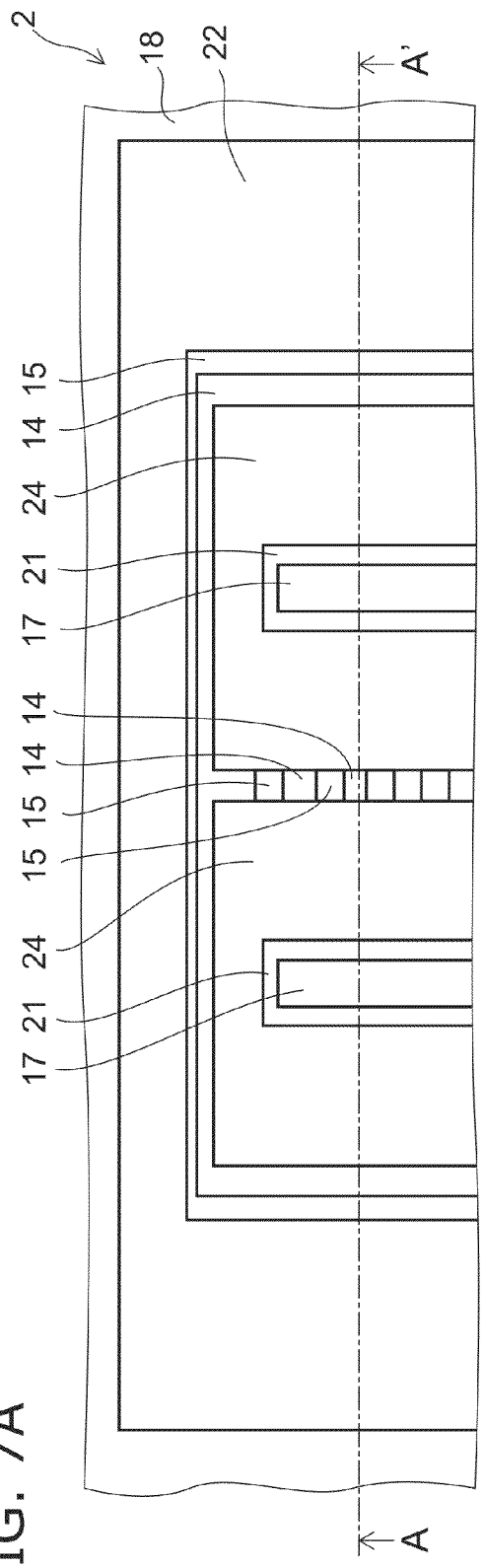
FIG. 7A is a plan view illustrating a semiconductor device according to a second embodiment.
Figure 7B:
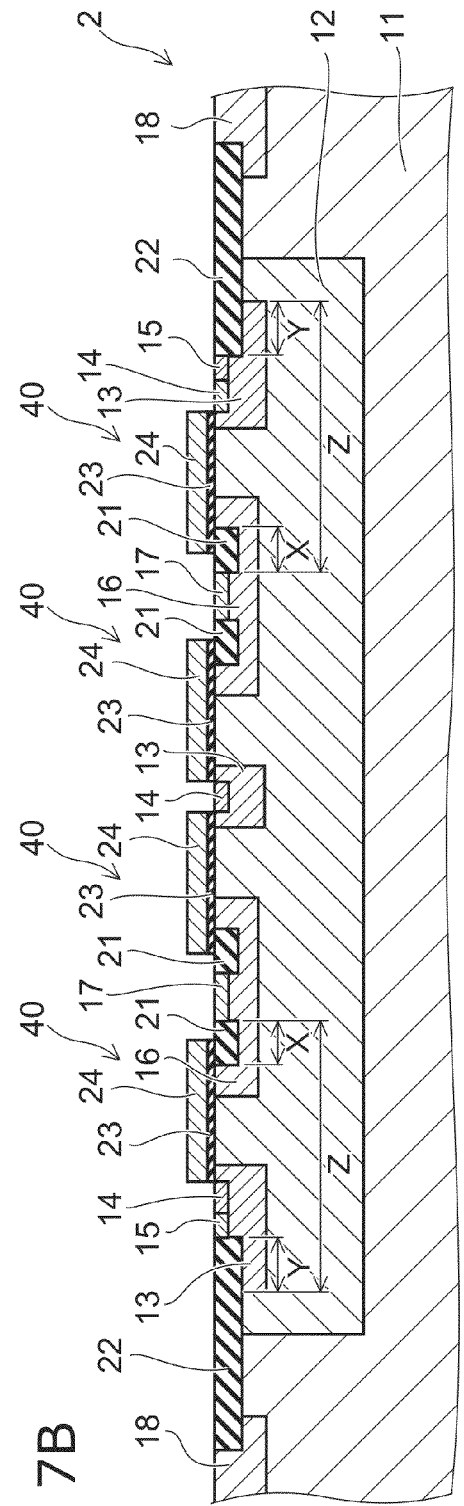
FIG. 7B is a sectional view taken along line A-A' shown in FIG. 7A.

FIG. 7A is a plan view illustrating a semiconductor device according to the embodiment. FIG. 7B is a sectional view taken along line A-A' shown in FIG. 7A.

As shown in FIGS. 7A and 7B, in the semiconductor device 2 according to the embodiment, as in the above first embodiment, a plurality of DMOS regions are defined.

In each DMOS region, a deep n-well 12 is formed on a p-type layer 11. On the deep n-well 12, a plurality of striped n-type wells 13 and p-type wells 16 are provided and alternately arranged along one direction (SD direction). However, at both ends of the row composed of the n-type wells 13 and the p-type wells 16, the n-type wells 13 are located. On each p-type well 16, a field insulating film 21 is placed so as to sandwich a $p^+$-type drain layer 17 in the SD direction. As viewed from above, the field insulating film 21 is shaped like a frame surrounding the $p^+$-type drain layer 17 shaped like a stripe. As viewed from above, the gate insulating film 23 and the gate electrode 24 are also shaped like a frame surrounding each $p^+$-type drain layer 17.

As viewed from above, the field insulating film 22 is shaped like a frame surrounding the entire row composed of the n-type wells 13 and the p-type wells 16. The inner peripheral portion of the field insulating film 22 is placed on the n-type well 13 located at both ends of the row, but is not placed on the other n-type wells 13. As viewed from above, the $p^+$-type device isolation region 18 is also shaped like a frame surrounding the insulating film 22. On the n-type wells 13 other than the n-type well 13 located at both ends of the row, $p^+$-type source layers 14 and $n^+$-type back gate layers 15 are alternately arranged along the direction orthogonal to the SD direction, i.e., along the extending direction of the n-type well 13.

As the result of such a configuration, in each DMOS region, on the deep n-well 12, the DMOS 40 described in the above first embodiment are repeatedly arranged along the SD direction with the orientation alternately reversed. In each DMOS region, the distance X is uniform, the distance Y is also uniform, and the distance Z is also uniform. Thus, the SD breakdown voltage of a plurality of DMOS 40 formed in each DMOS region is mutually equal.

On the other hand, between the DMOS regions, the distance X is mutually different. Thus, the SD breakdown voltage of DMOS is mutually different. Furthermore, between the DMOS regions, the distance Y is also mutually different. However, the DMOS region having a longer distance X has a shorter distance Y. Thus, between the DMOS regions, the substrate breakdown voltage of the DMOS 40 is generally uniform.

In the embodiment, in each DMOS region, a plurality of DMOS 40 connected in parallel to each other can be formed.

The field insulating film 21 is provided in each DMOS 40. However, the field insulating film 22 is provided only in the outer peripheral portion of the DMOS region. Thus, in the cross section parallel to the SD direction, the number of occurrences of the field insulating film 21 is larger than the number of occurrences of the field insulating film 22. Accordingly, in the case of decreasing the distance X and increasing the distance Y to decrease the SD breakdown voltage of the DMOS 40, the effect of decreasing the distance X contributing to the entire size of the DMOS region is greater than the effect of increasing the distance Y. Thus, the entire size of the DMOS region can be reduced. Accordingly, the semiconductor device can be downsized. The configuration, function, and effect of the embodiment other than the foregoing are similar to those of the above first embodiment.

Next, a third embodiment is described.

Figure 8A:
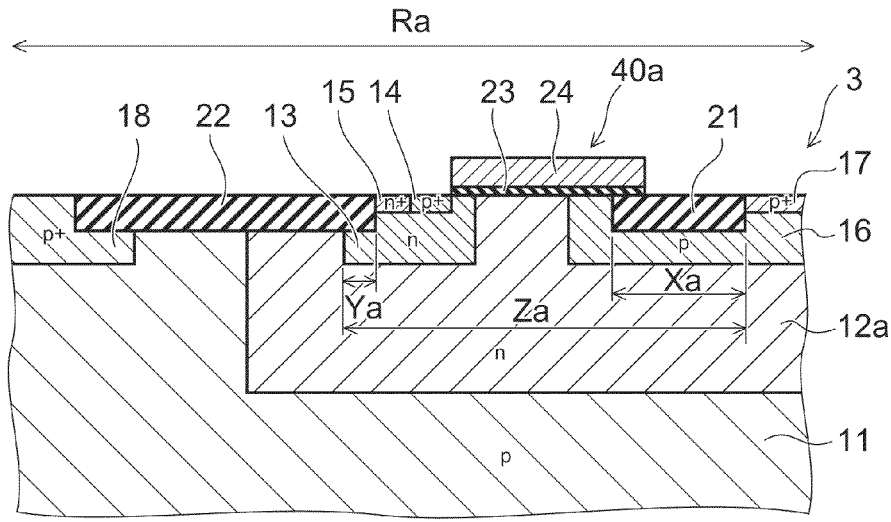
FIGS. 8A to 8C are sectional views illustrating a semiconductor device according to a third embodiment.
Figure 8B:
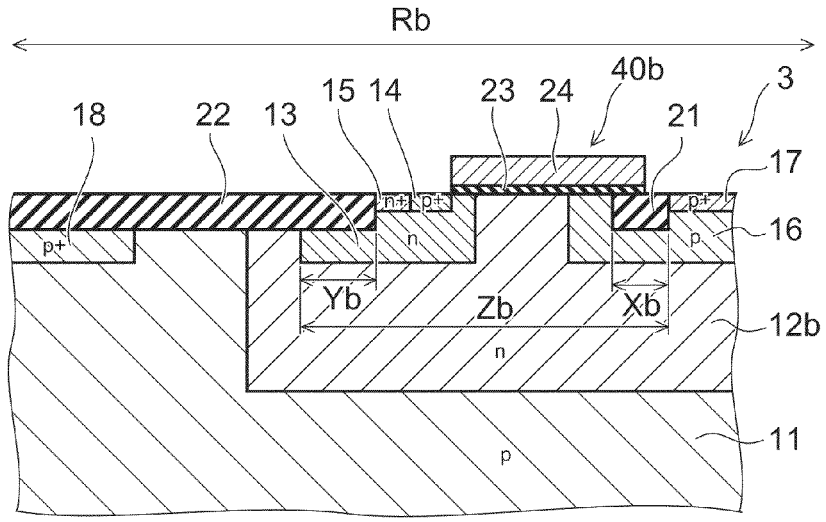
Figure 8C:
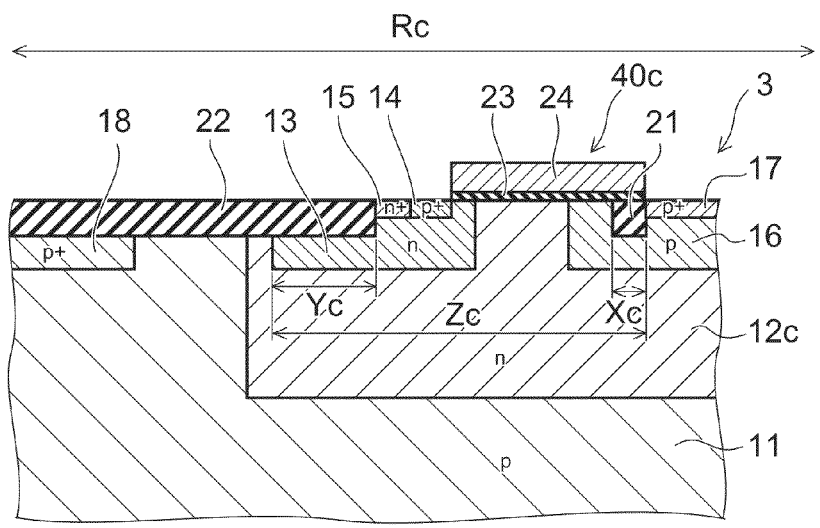

FIGS. 8A to 8C are sectional views illustrating a semiconductor device according to the embodiment.

FIGS. 8A to 8C show different regions on the same semiconductor substrate.

As shown in FIGS. 8A to 8C, in the semiconductor device 3 according to the embodiment, three DMOS regions Ra, Rb, Rc are defined. In each DMOS region, the DMOS 40 as described in the above first embodiment is formed.

Also among the DMOS regions Ra, Rb, Rc, the region having a longer distance X has a shorter distance Y. That is, Xa>Xb>Xc and Ya<Yb<Yc hold. Thus, the SD breakdown voltage of the DMOS 40a formed in the DMOS region Ra is the highest. The SD breakdown voltage of the DMOS 40b formed in the DMOS region Rb is the next highest. The SD breakdown voltage of the DMOS 40c formed in the DMOS region Rc is the lowest. On the other hand, the substrate breakdown voltage is generally uniform among the DMOS regions.

One example is now described. The SD breakdown voltage of the DMOS 40a is 35-60 V (volts), the distance Xa is 2.5-4.0 μm, the distance Ya is 0-0.5 μm, and the distance Za is 5-10 μm. The SD breakdown voltage of the DMOS 40b is 25-35 V, the distance Xb is 2.0-2.5 μm, the distance Yb is 0.3-1.0 μm, and the distance Zb is 4-6 μm. The SD breakdown voltage of the DMOS 40c is 12-25 V, the distance Xc is 1.5-2.0 μm, the distance Yc is 1.0-2.0 μm, and the distance Zc is 3-4 μm. The distance W is 0.5-1.5 μm in all cases. The substrate breakdown voltage of the DMOS 40a, 40b and 40c is approximately 40-60 V in all cases.

In this example, for instance, the effective impurity concentration of the deep n-well 12 is $1\times10^{15}$-$1\times10^{18}$ cm$^{-3}$. The effective impurity concentration of the n-type well 13 is $1\times10^{16}$-$1\times10^{18}$ cm$^{-3}$. The effective impurity concentration of the p$^+$-type source layer 14 is $1\times10^{19}$-$1\times10^{21}$ cm$^{-3}$. The effective impurity concentration of the n$^+$-type back gate layer 15 is $1\times10^{19}$-$1\times10^{21}$ cm$^{-3}$. The effective impurity concentration of the p-type well 16 is $1\times10^{16}$-$1\times10^{18}$ cm$^{-3}$. The effective impurity concentration of the p$^+$-type drain layer 17 is $1\times10^{19}$-$1\times10^{21}$ cm$^{-3}$. The effective impurity concentration of the p$^+$-type device isolation region 18 is $1\times10^{16}$-$1\times10^{18}$ cm$^{-3}$.

The configuration, function, and effect of the embodiment other than the foregoing are similar to those of the above first embodiment.

In the example illustrated in the embodiment, the SD breakdown voltage of the DMOS 40 is set to three levels. However, the SD breakdown voltage may have four or more levels. Furthermore, also in the embodiment, as in the above second embodiment, n-type wells 13 and p-type wells 16 may be alternately arranged in each DMOS region to form a plurality of DMOS 40. Furthermore, in the example illustrated in the above embodiments, p-channel DMOS is formed. However, n-channel DMOS may be formed.

Next, a fourth embodiment is described.

Figure 9:
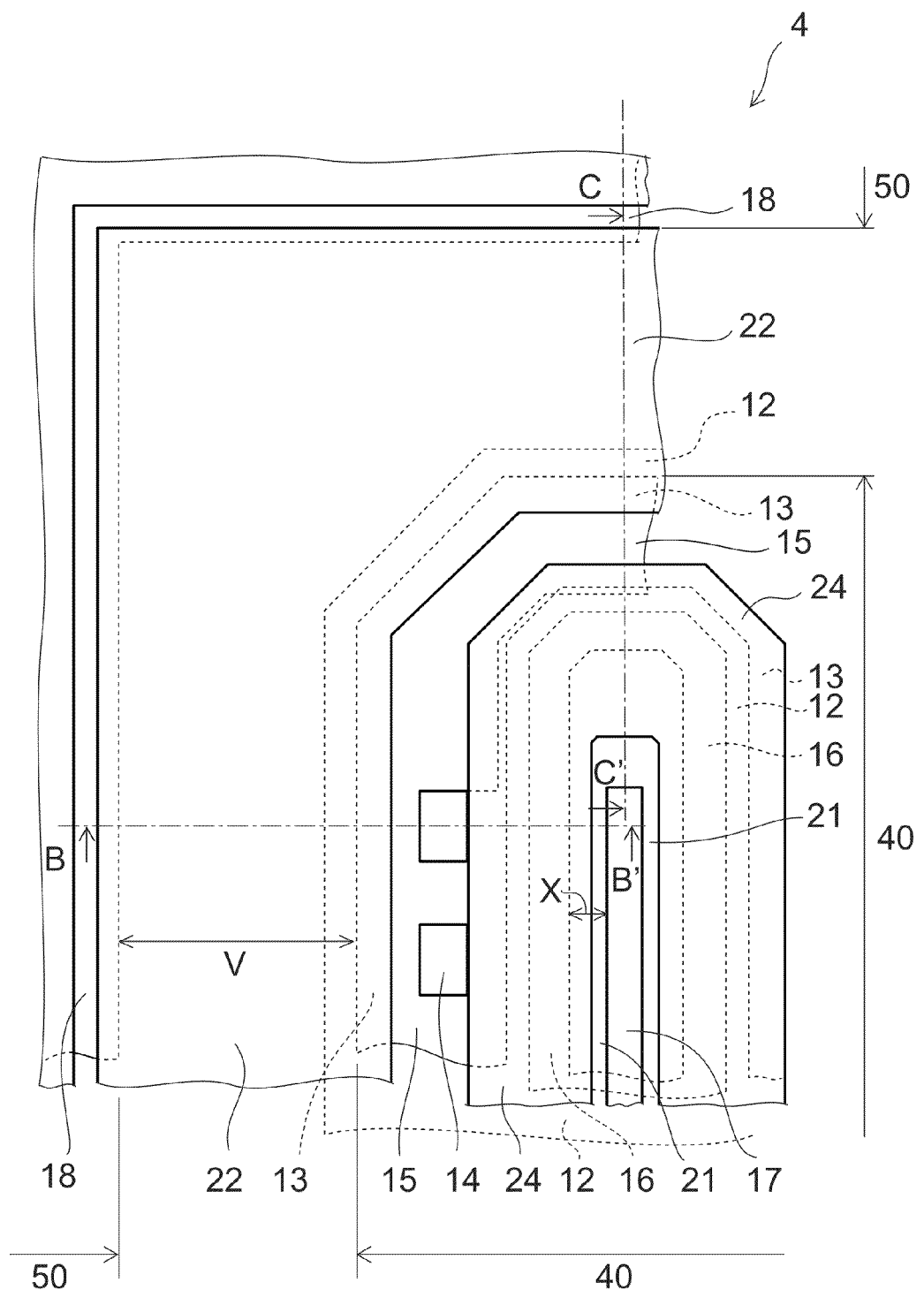
FIG. 9 is a plan view illustrating a semiconductor device according to a fourth embodiment.

FIG. 9 is a plan view illustrating a semiconductor device according to the embodiment.

Figure 10A:
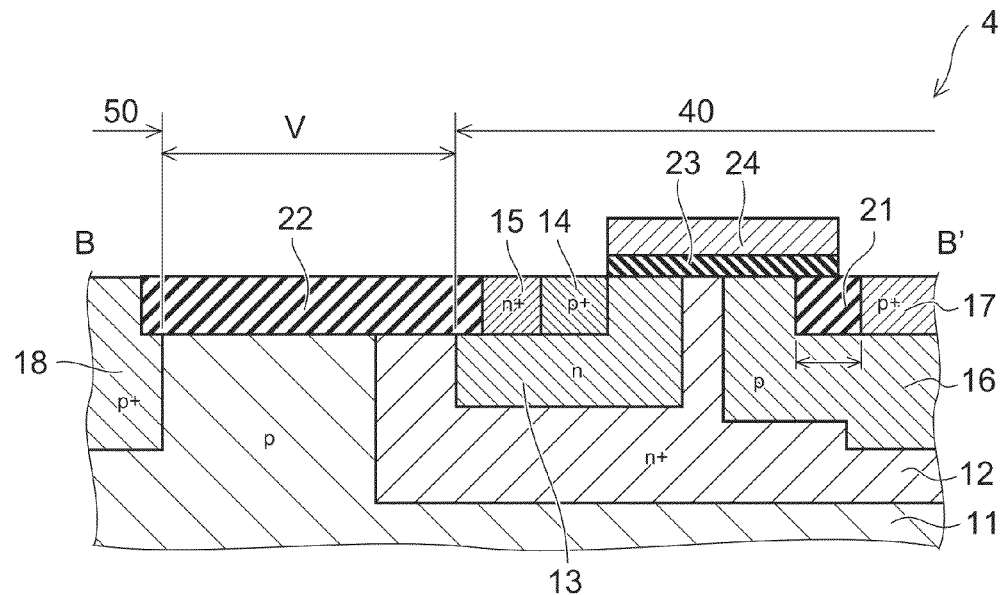
FIG. 10A is a sectional view taken along line B-B' shown in FIG. 9.
Figure 10B:
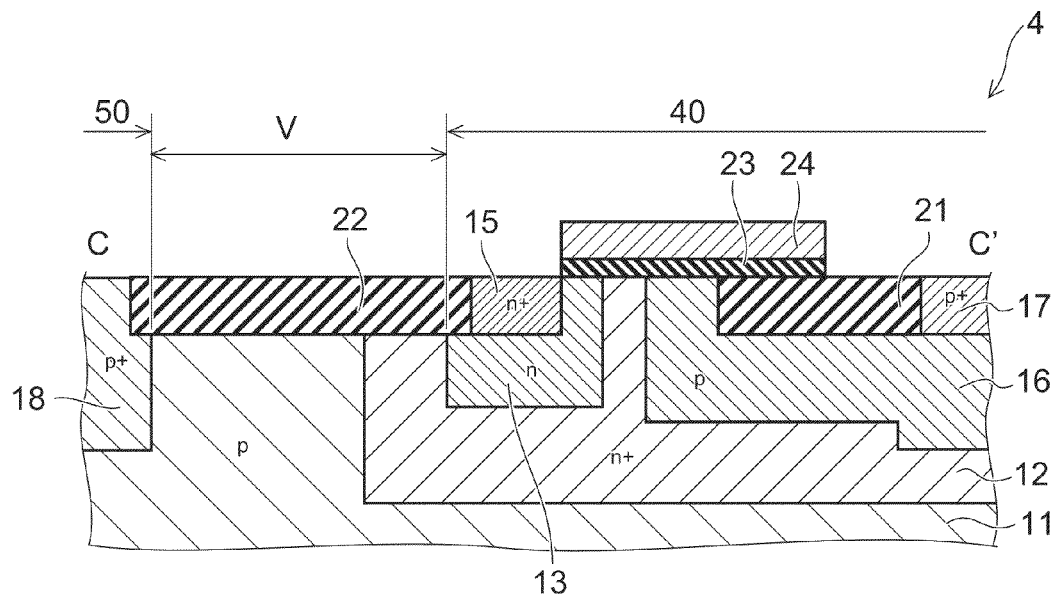
FIG. 10B is a sectional view taken along line C-C' shown in FIG. 9.

FIG. 10A is a sectional view taken along line B-B' shown in FIG. 9. FIG. 10B is a sectional view taken along line C-C' shown in FIG. 9.

Figure 11A:
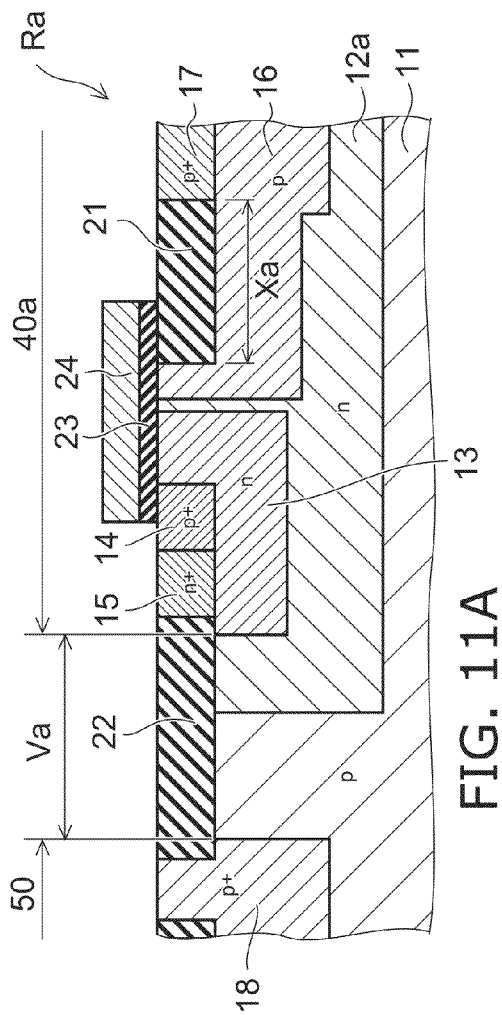
FIGS. 11A and 11C are sectional views illustrating the semiconductor device according to the fourth embodiment.
Figure 11B:
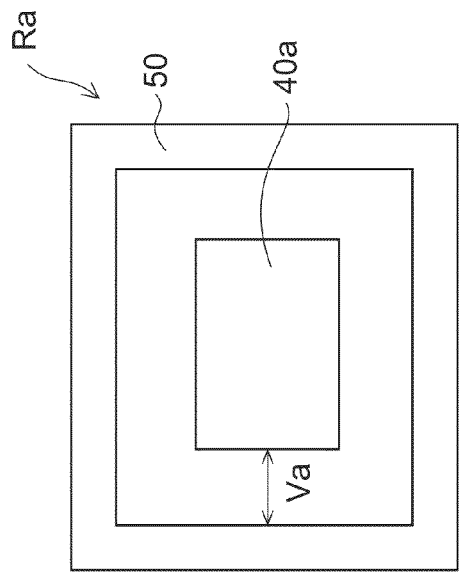
FIGS. 11B and 11D are plan views illustrating the semiconductor device according to the fourth embodiment.
Figure 11C:
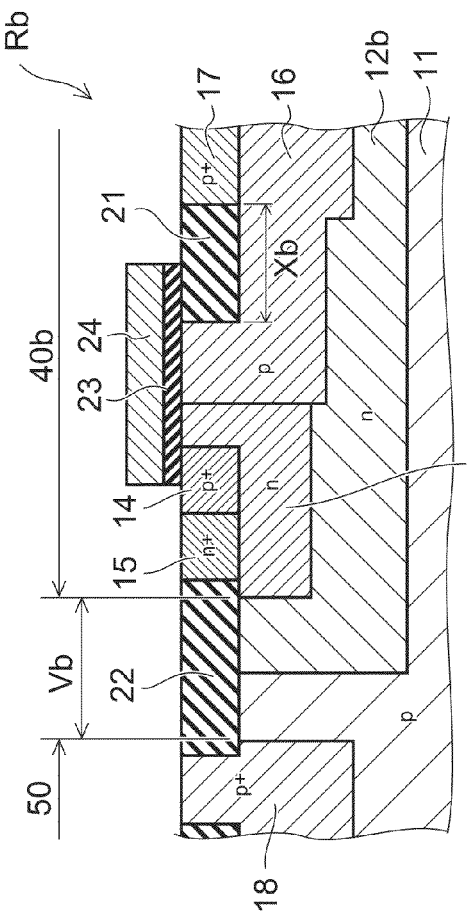
Figure 11D:
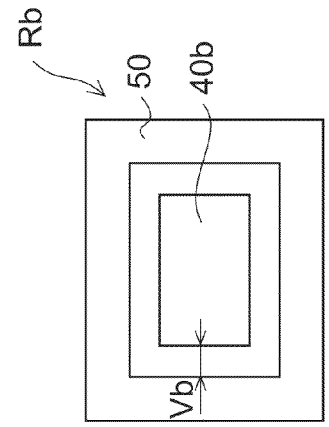

FIGS. 11A and 11C are sectional views illustrating the semiconductor device according to the embodiment. FIGS. 11B and 11D are plan views illustrating the semiconductor device according to the embodiment.

Figures 12A, 12B:
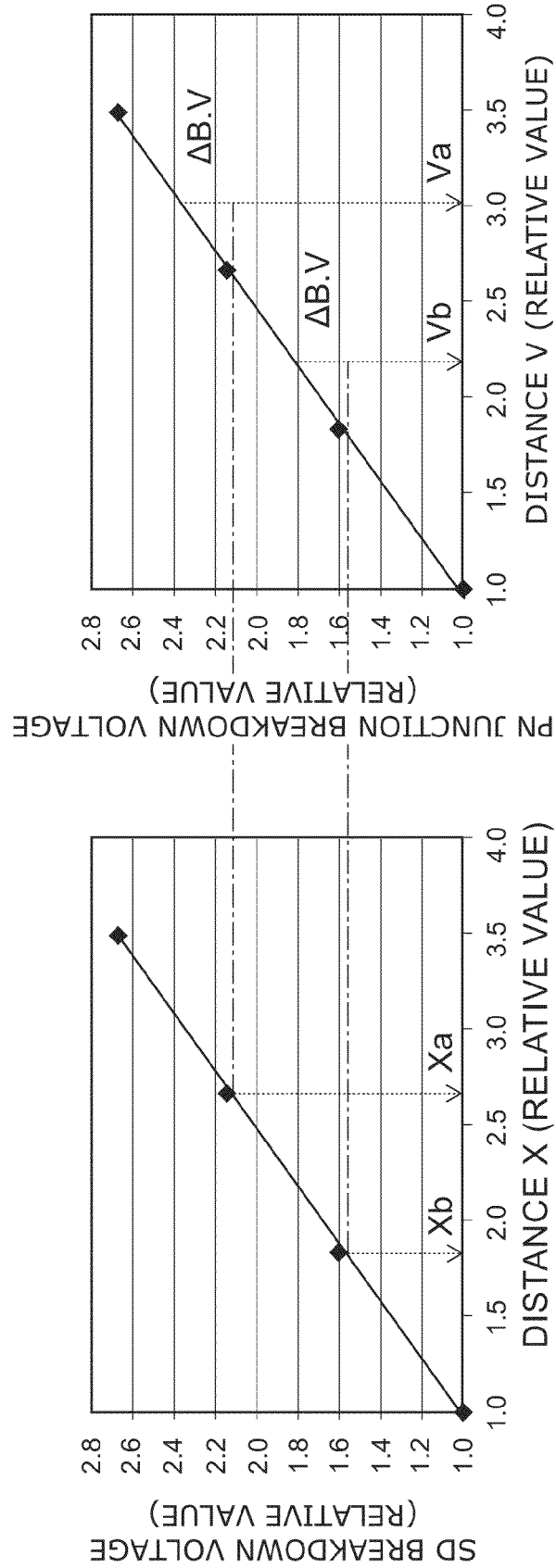
FIG. 12A is a graph illustrating the influence of the distance X on the SD breakdown voltage with the distance X taken on the horizontal axis and the SD breakdown voltage taken on the vertical axis.
FIG. 12B is a graph illustrating the influence of the distance V on the pn junction breakdown voltage with the distance V taken on the horizontal axis and the pn junction breakdown voltage taken on the vertical axis.

FIG. 12A is a graph illustrating the influence of the distance X on the SD breakdown voltage with the distance X taken on the horizontal axis and the SD breakdown voltage taken on the vertical axis. FIG. 12B is a graph illustrating the influence of the distance V on the pn junction breakdown voltage with the distance V taken on the horizontal axis and the pn junction breakdown voltage taken on the vertical axis.

As described above with reference to FIG. 2, the DMOS 40 has a parasitic pnp bipolar transistor 41 with the p-type layer 11 serving as a collector, the deep n-well 12 serving as a base, and the p-type well 16 and the p$^+$-type drain layer 17 serving as an emitter. The substrate breakdown voltage of the DMOS 40 is determined by the lower breakdown voltage of the pn junction breakdown voltage between the p-type layer 11 and the deep n-well 12, and the collector-emitter punch through breakdown voltage of the parasitic pnp bipolar transistor 41.

In the above first to third embodiments, the punch through breakdown voltage is lower than the pn junction breakdown voltage. Thus, the substrate breakdown voltage is determined by the distance Z. In contrast, in this embodiment, the pn junction breakdown voltage is lower than the punch through breakdown voltage. Thus, the substrate breakdown voltage is determined by the distance V between the n-type wells 13 and the p$^+$-type device isolation region 18.

Also in the semiconductor device according to the embodiment, two DMOS regions Ra and Rb separated from each other are defined as in the above first embodiment. First, the common configuration of the DMOS regions Ra and Rb is described.

As shown in FIGS. 9, 10A, and 10B, in the semiconductor device 4 according to the embodiment, a field 50 is provided around the DMOS 40. As described above, a deep n-well 12 is formed in the DMOS 40, a n-type well 13 and a p-type well 16 are formed on the deep n-well 12. A p$^+$-type source layer 14 and an n$^+$-type back gate layer 15 are formed on the n-type well 13, a p$^+$-type drain layer 17 is formed on the p-type well 16. On the other hand, a p$^+$-type device isolation region 18 is formed in the field 50. The field 50 is separated from the DMOS 40. That is, the p$^+$-type device isolation region 18 is separated from the n-type well 13. The distance between the p$^+$-type device isolation region 18 and the n-type well 13 is referred to as distance V. The distance V is defined not only about the SD direction but about all directions. That is, the distance V is the shortest distance between the n-type well 13 and the p$^+$-type device isolation region 18. On the other hand, as in the first embodiment, the length of the field insulating film 21 in the SD direction is referred to as distance X.

As shown in FIGS. 11A to 11D, in the semiconductor device 4, the DMOS 40a provided in the region Ra and the DMOS 40b provided in the region Rb are mutually different in distance X, and also mutually different in distance V.

The distance Xa of the DMOS 40a is longer than the distance Xb of the DMOS 40b. The distance Va of the DMOS 40a is longer than the distance Vb of the DMOS 40b. That is, Xa>Xb and Va>Vb hold. Thus, in the case where the length of the field insulating film 21 (distance X) in the DMOS 40 is long, the distance V between the DMOS 40 and the field region 50 therearound is also long.

Next, the function and effect of the semiconductor device 4 according to the embodiment are described.

As described above, the DMOS 40a and the DMOS 40b are mutually different in distance X, satisfying Xa>Xb. Thus, the SD breakdown voltage of the DMOS 40a is higher than the SD breakdown voltage of the DMOS 40b. This enables the semiconductor device 4 to include two kinds of DMOS mutually different in SD breakdown voltage. Thus, a DMOS having an appropriate breakdown voltage can be used in accordance with the purpose of the circuit. This can optimize the chip size.

Furthermore, the DMOS 40a and the DMOS 40b are mutually different in distance V, satisfying Va>Vb. As a result, the pn junction breakdown voltage of the DMOS 40a is higher than the pn junction breakdown voltage of the DMOS 40b. Thus, in the semiconductor device 4, for the DMOS 40 having a higher SD breakdown voltage, the pn junction breakdown voltage is set higher, and hence the substrate breakdown voltage is set higher. Accordingly, when the DMOS 40 is applied with ESD (electrostatic discharge), breakdown occurs earlier for the SD breakdown voltage than for the substrate breakdown voltage. Thus, the current flows inside the DMOS 40 rather than the end of the DMOS 40. As a result, the ESD current is less likely to concentrate, and the semiconductor device 4 is less prone to destruction.

As shown in FIGS. 12A and 12B, the SD breakdown voltage of the DMOS 40 has a nearly linear positive correlation with the distance X. The pn junction breakdown voltage has a nearly linear positive correlation with the distance V. In any of the DMOS 40, the pn junction breakdown voltage is set higher by a prescribed voltage $\Delta$B.V than the SD breakdown voltage.

As a result, in the semiconductor device 4 according to the embodiment, in any of the regions, the pn junction breakdown voltage is set higher than the SD breakdown voltage. Furthermore, the pn junction breakdown voltage is not set excessively high, and the distance V is not set excessively long. Thus, each region can be designed with a minimum area while ensuring the substrate breakdown voltage required for the region. Accordingly, the semiconductor device 4 can be downsized.

The configuration, function, and effect of the embodiment other than the foregoing are similar to those of the above first embodiment.

The embodiments described above can realize a semiconductor device having high substrate breakdown voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device comprising a first transistor and a second transistor on a substrate, the first transistor comprising:
a first semiconductor layer of a first conductivity type;
a second semiconductor layer of the first conductivity type provided on part of the first semiconductor layer;
a first source of a second conductivity type provided on part of the second semiconductor layer;
a third semiconductor layer of the second conductivity type provided on part of the first semiconductor layer;
a first drain of the second conductivity type provided on part of the third semiconductor layer, and having a higher effective impurity concentration than the third semiconductor layer;
a fourth semiconductor layer of the second conductivity type separated from the first semiconductor layer;
a first insulating film provided on part of the third semiconductor layer between the first source and the first drain;
a first gate insulating film provided on part of the second semiconductor layer between the first source and the third semiconductor layer; and
a first gate electrode provided on the first gate insulating film, the second transistor comprising:
a fifth semiconductor layer of the first conductivity type;
a sixth semiconductor layer of the first conductivity type provided on part of the fifth semiconductor layer;
a second source of the second conductivity type provided on part of the sixth semiconductor layer;
a seventh semiconductor layer of the second conductivity type provided on part of the fifth semiconductor layer;
a second drain of the second conductivity type provided on part of the seventh semiconductor layer, and having a higher effective impurity concentration than the seventh semiconductor layer;
an eighth semiconductor layer of the second conductivity type separated from the fifth semiconductor layer;
a second insulating film provided on part of the seventh semiconductor layer between the second source and the second drain;
a second gate insulating film provided on part of the sixth semiconductor layer between the second source and the seventh semiconductor layer; and
a second gate electrode provided on the second gate insulating film, wherein
a first distance between both ends of the first insulating film in a direction connecting the first source and the first drain is longer than a second distance between both ends of the second insulating film in a direction connecting the second source and the second drain, and
a third distance between the second semiconductor layer and the fourth semiconductor layer is longer than a fourth distance between the sixth semiconductor layer and the eighth semiconductor layer.

2. The device according to claim 1, wherein
the fourth semiconductor layer surrounds the first semiconductor layer, and
the eighth semiconductor layer surrounds the fifth semiconductor layer.

3. The device according to claim 1, wherein
the first transistor further comprises a third insulating film provided from above an end portion of the second semiconductor layer on an outer peripheral side of the first semiconductor layer to outside the first semiconductor layer, and
the second transistor further comprises a fourth insulating film provided from above an end portion of the sixth semiconductor layer on an outer peripheral side of the fifth semiconductor layer to outside the fifth semiconductor layer.

4. The device according to claim 3, wherein
an end portion of the third insulating film is located on an end portion of the fourth semiconductor layer, and
an end portion of the fourth insulating film is located on an end portion of the eighth semiconductor layer.

5. The device according to claim 1, wherein
the first transistor further comprises a ninth semiconductor layer provided on the second semiconductor layer, having the second conductivity type, and having a higher effective impurity concentration than the second semiconductor layer, and
the second transistor further comprises a tenth semiconductor layer provided on the sixth semiconductor layer, having the second conductivity, and having a higher effective impurity concentration than the sixth semiconductor layer.

6. The device according to claim 5, wherein
the first source and the ninth semiconductor layers are alternately arranged along a direction orthogonal to the direction connecting the first source and the first drain, and
the second source and the tenth semiconductor layers are alternately arranged along a direction orthogonal to the direction connecting the second source and second drain.

7. The device according to claim 1, wherein the third semiconductor layer is separated from the second semiconductor layer.

8. The device according to claim 1, wherein
the first distance is a distance between both ends of the first insulating film in a top surface, and
the second distance is a distance between both ends of the second insulating film in a top surface.

9. The device according to claim 1, wherein
the third distance is a distance between a first connection point and a second connection point, the first connection point is a connection of the second semiconductor layer and a under surface of the third insulating film, the second connection point is a connection of the fourth semiconductor layer and the under surface of the third insulating film, and
the fourth distance is a distance between a third connection point and a fourth connection point, the third connection point is a connection of the sixth semiconductor layer and a under surface of the fourth insulating film, the fourth connection point is a connection of the eighth semiconductor layer and the under surface of the fourth insulating film.

10. A semiconductor device comprising a first transistor and a second transistor on a substrate,
the first transistor comprising:
a first semiconductor layer of a first conductivity type;
a second semiconductor layer of a second conductivity type provided on part of the first semiconductor layer;
a third semiconductor layer of the second conductivity type provided on part of the second semiconductor layer;
a first source of the first conductivity type provided on part of the third semiconductor layer;
a fourth semiconductor layer of the first conductivity type provided on part of the second semiconductor layer;
a first drain of the first conductivity type provided on part of the fourth semiconductor layer, and having a higher effective impurity concentration than the fourth semiconductor layer;
a fifth semiconductor layer of the first conductivity type provided on the first semiconductor layer, separated from the second semiconductor layer, and having a higher effective impurity concentration than the first semiconductor layer;
a first insulating film provided on part of the fourth semiconductor layer between the first source and the first drain;
a first gate insulating film provided on part of the third semiconductor layer between the first source and the fourth semiconductor layer; and
a first gate electrode provided on the first gate insulating film,
the second transistor comprising:
a sixth semiconductor layer of the first conductivity type;
a seventh semiconductor layer of the second conductivity type;
an eighth semiconductor layer of the second conductivity type provided on part of the sixth semiconductor layer;
a second source of the first conductivity type provided on part of the eighth semiconductor layer;
a ninth semiconductor layer of the first conductivity type provided on part of the seventh semiconductor layer;
a second drain of the first conductivity type provided on part of the ninth semiconductor layer, and having a higher effective impurity concentration than the ninth semiconductor layer;
a tenth semiconductor layer of the first conductivity type provided on the sixth semiconductor layer, separated from the seventh semiconductor layer, and having a higher effective impurity concentration than the sixth semiconductor layer separated from the eighth semiconductor layer;
a second insulating film provided on part of the ninth semiconductor layer between the second source and the second drain;
a second gate insulating film provided on part of the eighth semiconductor layer between the second source and the ninth semiconductor layer; and
a second gate electrode provided on the second gate insulating film,
wherein
a first distance between both ends of the first insulating film in a direction connecting the first source and the first drain is longer than a second distance between both ends of the second insulating film in a direction connecting the second source and the second drain, and
a third distance between the third semiconductor layer and the fifth semiconductor layer is longer than a fourth distance between the eight semiconductor layer and the tenth semiconductor layer.

11. The device according to claim 10, wherein
the fifth semiconductor layer surrounds the second semiconductor layer, and
the tenth semiconductor layer surrounds the seventh semiconductor layer.

12. The device according to claim 10, wherein
the first transistor further comprises a third insulating film provided from above an end portion of the third semiconductor layer on an outer peripheral side of the second semiconductor layer to above a portion of the first semiconductor layer outside the second semiconductor layer, and
the second transistor further comprises a fourth insulating film provided from above an end portion of the eighth semiconductor layer on an outer peripheral side of the seventh semiconductor layer to above a portion of the sixth semiconductor layer outside the seventh semiconductor layer.

13. The device according to claim 12, wherein
an end portion of the third insulating film is located on an end portion of the fifth semiconductor layer, and
an end portion of the fourth insulating film is located on an end portion of the tenth semiconductor layer.

14. The device according to claim 10, wherein
the first transistor further comprises a eleventh semiconductor layer provided on the third semiconductor layer, having the second conductivity type, and having a higher effective impurity concentration than the third semiconductor layer, and the second transistor further comprises a twelfth semiconductor layer provided on the eighth semiconductor layer, having the second conductivity, and having a higher effective impurity concentration than the eighth semiconductor layer.

15. The device according to claim 14, wherein
the first source and the eleventh semiconductor layers are alternately arranged along a direction orthogonal to the direction connecting the first source and the first drain, and
the second source and the twelfth semiconductor layers are alternately arranged along a direction orthogonal to the direction connecting the second source and second drain.

16. The device according to claim 10, wherein the fourth semiconductor layer is separated from the third semiconductor layer.

17. The device according to claim 10, wherein
the first distance is a distance between both ends of the first insulating film in a top surface, and
the second distance is a distance between both ends of the second insulating film in a top surface.

18. The device according to claim 10, wherein
the third distance is a distance between a first connection point and a second connection point, the first connection point is a connection of the third semiconductor layer and a under surface of the third insulating film, the second connection point is a connection of the fifth semiconductor layer and the under surface of the third insulating film, and
the fourth distance is a distance between a third connection point and a fourth connection point, the third connection point is a connection of the eighth semiconductor layer and a under surface of the fourth insulating film, the fourth connection point is a connection of the tenth semiconductor layer and the under surface of the fourth insulating film.

* * * * *